United States Patent
Wu et al.

(10) Patent No.: US 11,115,033 B1
(45) Date of Patent: Sep. 7, 2021

(54) SPEED-UP CHARGE PUMP AND PHASE-LOCKED LOOP AND METHOD FOR OPERATING THE SAME

(71) Applicant: United Microelectronics Corp., Hsinchu (TW)

(72) Inventors: Kun-Yuan Wu, Kaohsiung (TW); Wei-Jen Wang, Tainan (TW); Chien-Fu Chen, Miaoli County (TW); Cheng-Yang Tsai, Tainan (TW); Ruei-Yau Chen, Pingtung County (TW); Yu-Lin Chen, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/065,414

(22) Filed: Oct. 7, 2020

(30) Foreign Application Priority Data

Sep. 9, 2020 (CN) .......................... 202010940159.7

(51) Int. Cl.
*H03L 7/089* (2006.01)
*H03L 7/099* (2006.01)

(52) U.S. Cl.
CPC ............ *H03L 7/0895* (2013.01); *H03L 7/099* (2013.01)

(58) Field of Classification Search
CPC ....... H03L 7/0895; H03L 7/099; H03L 7/087; H03L 7/0891; H03L 7/0898; H03L 7/0896; H03L 7/0995; H03L 7/085; H03L 7/095; H03L 7/18; H03L 7/091; H03L 7/0893; H03L 7/10; H03L 7/0812; H03L 7/093
USPC .......................................... 327/156, 158, 161
See application file for complete search history.

(56) References Cited

U.S. PATENT DOCUMENTS

| | | | |
|---|---|---|---|
| 6,560,306 B1 | 5/2003 | Duffy et al. | |
| 7,388,440 B1 | 6/2008 | Giust et al. | |
| 2004/0169563 A1* | 9/2004 | Abbasi | H03L 7/107 331/160 |
| 2012/0153999 A1* | 6/2012 | Kim | H03L 7/0895 327/157 |
| 2014/0240003 A1 | 8/2014 | Buch et al. | |

* cited by examiner

*Primary Examiner* — John W Poos
(74) *Attorney, Agent, or Firm* — J.C. Patents

(57) ABSTRACT

A speed-up charge pump includes a first charge pump for receiving an up signal and a down signal in digital form to produce a first voltage control signal at an output node. Further, at least one speed-up phase detector includes a first circuit path to receive the up signal and delay the up signal by a predetermined delay as a delay up signal and operate the up signal and the delay up signal by AND logic into an auxiliary up signal; and a second circuit path to receive the down signal and delay the down signal by the predetermined delay as a delay down signal and operate the down signal and the delay down signal by AND logic into an auxiliary down signal. A second charge pump is respectively receiving the auxiliary up and down signals to produce a second voltage control signal also at the output node.

20 Claims, 5 Drawing Sheets

Speed up phase-locked case

Normal case

SPEED-UP CHARGE PUMP AND PHASE-LOCKED LOOP AND METHOD FOR OPERATING THE SAME

CROSS-REFERENCE TO RELATED APPLICATION

This application claims the priority benefit of China application serial no. 202010940159.7, filed on Sep. 9, 2020. The entirety of the above-mentioned patent application is hereby incorporated by reference herein and made a part of this specification.

BACKGROUND OF THE INVENTION

Field of the Invention

The invention relates to a phase-locked loop, and particularly related to a phase-locked loop with speed-up charge pump.

Description of Related Art

Stable and accurate frequency signal is one of key factors to control or operate an electronic circuit. To have the signal with sable frequency, a phase locked loop (PLL) is widely used. The PLL is a control system that generates an output signal whose phase is related to the phase of an input signal. There are several different types of PLL in the market. Generally, the PLL is an electronic circuit, including a variable frequency oscillator and a phase detector in a feedback loop. The oscillator generates a periodic signal, and the phase detector compares the phase of that signal with the phase of the input periodic signal, adjusting the oscillator to keep the phases matched.

Keeping the match of the input and output phases in locking operation also implies keeping the input and output frequencies the same. Consequently, in addition to the use of synchronizing signals, a phase-locked loop can track an input frequency, or it can generate a frequency signal that is a multiple of the input frequency. These properties in an example may be used for computer clock synchronization, demodulation, frequency synthesis, and so on.

The PLL is widely employed in radio, telecommunications, computers and other electronic apparatuses. The PLL in examples may be used to demodulate a signal, recover a signal from a noisy communication channel, generate a stable frequency at multiples of an input frequency, or distribute precisely timed clock pulses in digital logic circuits such as microprocessors. Since a single integrated circuit can provide a complete phase-locked-loop building block, the technique is widely used in modern electronic devices, with output frequency signals as needed based on the PLL.

However, in actual operation of PLL, a large phase-shift in an example would appear in power-on stage or be disturbed by noise. It then would spend more time to do phase-locked to obtain accuracy frequency. The PLL circuit is still under development to improve the performance.

SUMMARY OF THE INVENTION

The invention provides a PLL with a speed-up charge pump and may be more efficiently generate the voltage control signal, which may be used to control a voltage control oscillator (VCO) to produce the frequency signal.

In an embodiment, the invention provides a speed-up charge pump including a first charge pump, at least one speed-up phase detector, and a at least one second charge pump. The first charge pump receives an up signal and a down signal in digital form to produce a first voltage control signal at an output node. The speed-up phase detector includes a first circuit path to receive the up signal and delay the up signal by a predetermined delay as a delay up signal and operate the up signal and the delay up signal by AND logic into an auxiliary up signal. The speed-up phase detector further includes a second circuit path to receive the down signal and delay the down signal by the predetermined delay as a delay down signal and operate the down signal and the delay down signal by AND logic into an auxiliary down signal. The second charge pump, respectively receiving the auxiliary up and down signals to produce a second voltage control signal also at the output node.

In an embodiment, as to the speed-up charge pump, the at least one speed-up phase detector is single with the predetermined delay and the at least one second charge pump is single.

In an embodiment, as to the speed-up charge pump, the at least one speed-up phase detector is plurality with a plurality of the predetermined delays and the at least one second charge pump is plurality corresponding to a quantity of the at least one speed-up phase detector.

In an embodiment, as to the speed-up charge pump, the up signal and the down signal are output from a phase frequency detector.

In an embodiment, as to the speed-up charge pump, the first charge pump includes: a first inverter, to receive the up signal; a first transistor pair, to receive the down signal; and a first power source string, between a ground voltage and a system voltage, under control by outputs from the first inverter and the first transistor pair to provide the first voltage control signal.

In an embodiment, as to the speed-up charge pump, the second charge pump includes: a second inverter, to receive the auxiliary up signal; a second transistor pair, to receive the auxiliary down signal; and a second power source string, between the ground voltage and the system voltage, under control by outputs from the second inverter and the second transistor pair to provide the second voltage control signal.

In an embodiment, as to the speed-up charge pump, the first voltage control signal and the second voltage control signal at the output node is used to control a voltage control oscillator to produce a frequency pulse signal.

In an embodiment, as to the speed-up charge pump, in each of the speed-up phase detector, the first circuit path includes: a first delay circuit with the predetermined delay, receiving the up signal and outputting the delay up signal; and a first AND logic gate, receiving the up signal and the delay up signal and outputting the auxiliary up signal. The second circuit path includes: a second delay circuit with the predetermined delay, receiving the down signal and outputting the delay down signal; and a second AND logic gate, receiving the down signal and the delay down signal and outputting the auxiliary down signal.

In an embodiment, the invention further provides a phase-locked loop, including a phase frequency detector, a first charge pump, at least one speed-up phase detector, at least one second charge pump, a low-pass filter, a voltage control oscillator and a frequency divider. The phase frequency detector, receiving a reference signal with a reference frequency and a feedback signal, and outputting an up signal and a down signal. The first charge pump receives the up signal and the down signal in digital form to produce a first voltage control signal at an output node. The at least one speed-up phase detector includes a first circuit path and a second circuit path. The first circuit path receives the up signal and delays the up signal by a predetermined delay as a delay up signal and operates the up signal and the delay up signal by AND logic into an auxiliary up signal. The second circuit path is to receive the down signal and delay the down signal by the predetermined delay as a delay down signal and operate the down signal and the delay down signal by AND logic into an auxiliary down signal. The at least one second charge pump respectively receives the auxiliary up and down signals to produce a second voltage control signal also at the output node of the first charge pump. The low-pass filter is filtering the first and second voltage control signals at the output node. The voltage control oscillator receives a voltage output of the low-pass filter to generate a frequency signal. The frequency divider is receiving the frequency signal to dividing in frequency by a factor N, being integer and greater than 0. An output of the frequency divider as the feedback signal is received by the phase frequency detector.

In an embodiment, as to the phase-locked loop, the at least one speed-up phase detector is single with the predetermined delay and the at least one second charge pump is single.

In an embodiment, as to the phase-locked loop, the at least one speed-up phase detector is plurality with a plurality of the predetermined delays and the at least one second charge pump is plurality corresponding to a quantity of the at least one speed-up phase detector.

In an embodiment, as to the phase-locked loop, the first charge pump includes: a first inverter, to receive the up signal; a first transistor pair, to receive the down signal; and a first power source string, between a ground voltage and a system voltage, under control by outputs from the first inverter and the first transistor pair to provide the first voltage control signal.

In an embodiment, as to the phase-locked loop, the second charge pump includes: a second inverter, to receive the auxiliary up signal; a second transistor pair, to receive the auxiliary down signal; and a second power source string, between the ground voltage and the system voltage, under control by outputs from the second inverter and the second transistor pair to provide the second voltage control signal.

In an embodiment, as to the phase-locked loop, in each of the speed-up phase detector, the first circuit path includes: a first delay circuit with the predetermined delay, receiving the up signal and outputting the delay up signal; and a first AND logic gate, receiving the up signal and the delay up signal and outputting the auxiliary up signal. The second circuit path includes: a second delay circuit with the predetermined delay, receiving the down signal and outputting the delay down signal; and a second AND logic gate, receiving the down signal and the delay down signal and outputting the auxiliary down signal.

In an embodiment, the invention further provides a method for operating speed-up charge pump. The method includes providing a first charge pump, receiving an up signal and a down signal in digital form to produce a first voltage control signal at an output node. Further, at least one speed-up phase detector is provided, including: providing a first circuit path to receive the up signal and delay the up signal by a predetermined delay as a delay up signal and operate the up signal and the delay up signal by AND logic into an auxiliary up signal; and providing a second circuit path to receive the down signal and delay the down signal by the predetermined delay as a delay down signal and operate the down signal and the delay down signal by AND logic into an auxiliary down signal. At least one second charge pump is provided, respectively receiving the auxiliary up and down signals to produce a second voltage control signal also at the output node.

In an embodiment, as to the method for operating speed-up charge pump, the at least one speed-up phase detector as provided is single with the predetermined delay and the at least one second charge pump is single.

In an embodiment, as to the method for operating speed-up charge pump, the at least one speed-up phase detector as provided is plurality with a plurality of the predetermined delays and the at least one second charge pump is plurality corresponding to a quantity of the at least one speed-up phase detector.

In an embodiment, as to the method for operating speed-up charge pump, the up signal and the down signal are output from a phase frequency detector.

In an embodiment, as to the method for operating speed-up charge pump, the first charge pump as provided includes: a first inverter, to receive the up signal; a first transistor pair, to receive the down signal; and a first power source string, between a ground voltage and a system voltage, under control by outputs from the first inverter and the first transistor pair to provide the first voltage control signal.

In an embodiment, as to the method for operating speed-up charge pump, the second charge pump as provided includes: a second inverter, to receive the auxiliary up signal; a second transistor pair, to receive the auxiliary down signal; and a second power source string, between the ground voltage and the system voltage, under control by outputs from the second inverter and the second transistor pair to provide the second voltage control signal.

In an embodiment, as to the method for operating speed-up charge pump, the first voltage control signal and the second voltage control signal at the output node is used to control a voltage control oscillator to produce a frequency pulse signal.

In an embodiment, the invention further provides a method for operating phase-locked loop. The method includes providing a phase frequency detector, receiving a reference signal with a reference frequency and a feedback signal, and outputting an up signal and a down signal. Further, a first charge pump is provided for receiving the up signal and the down signal in digital form to produce a first voltage control signal at an output node. At least one speed-up phase detector is provided, including: providing a first circuit path to receive the up signal and delay the up signal by a predetermined delay as a delay up signal and operate the up signal and the delay up signal by AND logic into an auxiliary up signal; and providing a second circuit path to receive the down signal and delay the down signal by the predetermined delay as a delay down signal and operate the down signal and the delay down signal by AND logic into an auxiliary down signal. At least one second charge pump is provided for respectively receiving the auxiliary up and down signals to produce a second voltage control signal also at the output node of the first charge pump. A low-pass filter is provided for filtering the first and second voltage control signals at the output node. A voltage control oscillator is provided for receiving a voltage output of the low-pass filter to generate a frequency signal. A frequency divider is provided for receiving the frequency signal to dividing a frequency by a factor N, being integer and greater than 0. An output of the frequency divider as the feedback signal is received by the phase frequency detector.

In an embodiment, as to the method for operating phase-locked loop, the at least one speed-up phase detector as provided is single with the predetermined delay and the at least one second charge pump is single.

In an embodiment, as to the method for operating phase-locked loop, the at least one speed-up phase detector as provided is plurality with a plurality of the predetermined delays and the at least one second charge pump is plurality corresponding to a quantity of the at least one speed-up phase detector.

In an embodiment, as to the method for operating phase-locked loop, the first charge pump as provided includes: a first inverter, to receive the up signal; a first transistor pair, to receive the down signal; and a first power source string, between a ground voltage and a system voltage, under control by outputs from the first inverter and the first transistor pair to provide the first voltage control signal.

In an embodiment, as to the method for operating phase-locked loop, the second charge pump as provided includes: a second inverter, to receive the auxiliary up signal; a second transistor pair, to receive the auxiliary down signal; and a second power source string, between the ground voltage and the system voltage, under control by outputs from the second inverter and the second transistor pair to provide the second voltage control signal.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention is directed to circuit design of a phase-locked loop (PLL) with a speed-up charge pump. The speed-up charge pump allows to charge up the output of a control voltage with higher speed when the phase frequency detector (PFD) has detected a case that out of order in phase or frequency occurs between the source signal and the feedback signal. The response time of the PLL may be reduced, so as to speed up the operation of the PLL according to embodiments of the invention.

Multiple embodiments are provided for describing the invention, but the invention is not just limited to the embodiments as provided.

Figure 1:
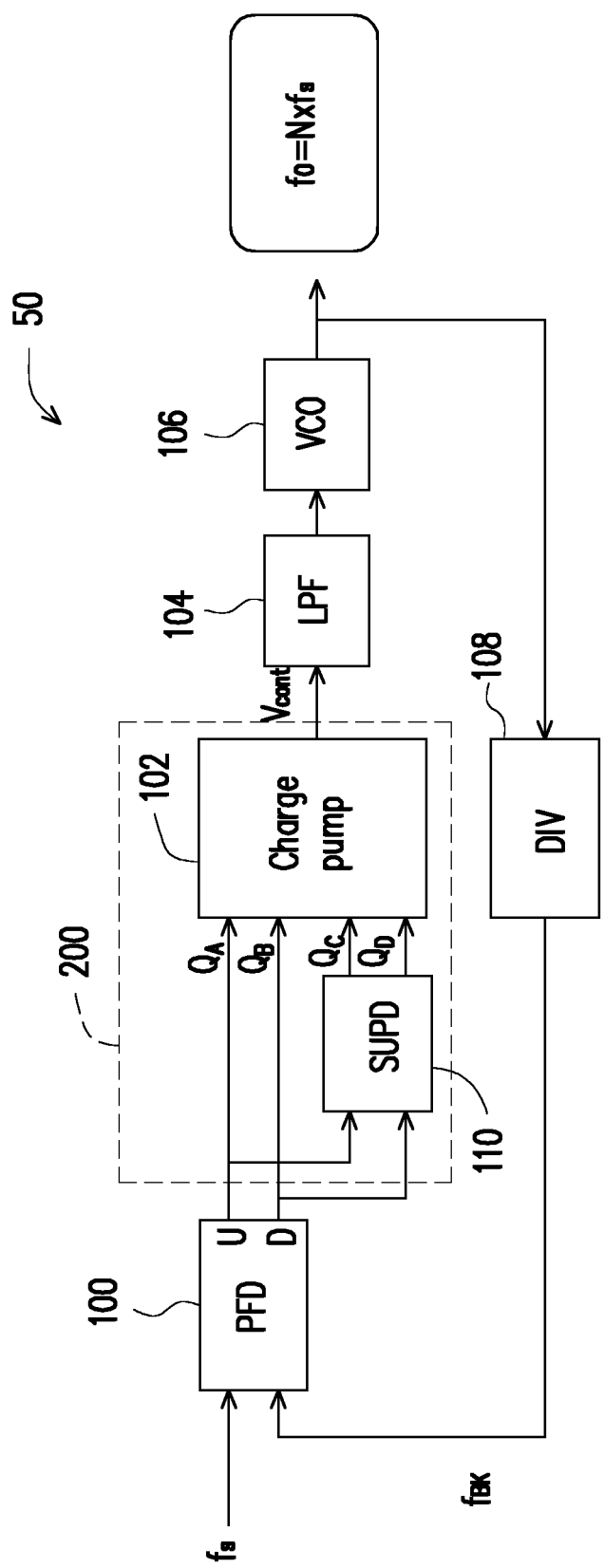
FIG. 1 is a drawing, schematically illustrating a circuit structure of phase-liked loop, according to an embodiment of the invention.

FIG. 1 is a drawing, schematically illustrating a circuit structure of phase-liked loop, according to an embodiment of the invention. Referring to FIG. 1, in general, a phase-locked loop 50 is provided, including a phase frequency detector (PFD) 100, a speed-up charge pump 200 having a charge pump 102 and a speed-up phase detector (SUPD) 110, a low-pass filter (LPF) 104, a voltage control oscillator (VCO) 106 and a frequency divider (DIV) 108.

Remarkably, the charge pump 102 includes a first charge pump 102a and a second charge pump 102b and even more as the third charge pump 102c, as to be described later in detail as referring to FIG. 6 and FIG. 8, in accordance with the number of the speed-up phase detectors 110 being implemented by one or more.

The phase frequency detector 100 receives a reference signal fs with a reference frequency and a feedback signal $f_{BK}$, in which the reference signal fs is a frequency signal as a source signal from quartz in an example. The phase frequency detector 100 outputs an up signal (U) and a down signal (D). The charge pump 102 receives the up signal (U) and the down signal (D) in digital form as a pair of detected signals $Q_A$ and $Q_B$, to produce a voltage control signal Vcont at an output node.

Remarkably, the speed-up phase detector 110 also provides an additional pair of detected signal $Q_C$ and $Q_D$. In the embodiment, one speed-up phase detector 110 is implemented. However, more units of the speed-up phase detector 110 with various delays in detection may be implemented to produce additional pair of detected signals, as to be described later.

The speed-up phase detector 110 and the charge pump 102 may be generally treated as a speed-up charge pump 200. Before describing the speeding mechanism in detail about the peed-up charge pump 200, the PLL in subsequent action is continuously described. The output of the charge pump 102 of the peed-up charge pump 200 is the voltage control signal Vcont, which is produced according to a combination from the pair of detected signals $Q_A$ and $Q_B$ and the pair of detected signals $Q_C$ and $Q_D$, in an embodiment. The number of the pairs of detected signals may be more, depending on various delays of frequency signal to be detected.

The low-pass filter 104 filters the noise portion and provide the voltage control signal to control the VCO 106. The invention does not need to limit to a specific circuit design of the VCO. The output of the VCO 106 is a frequency signal fo having frequency being multiplied by N, which is an integer and more than 0. In an example, the frequency signal fo has the frequency N time of the frequency of the reference signal fs. Then, a divider 108 receives the output frequency signal fo and divides by the factor N into the feedback signal $f_{BK}$ for the next loop operation.

The invention has proposed the speed-up charge pump 200 to receive the up and down signals at the U and D terminals of the PFD 100. The detection mechanism is described as follows.

Figure 2:
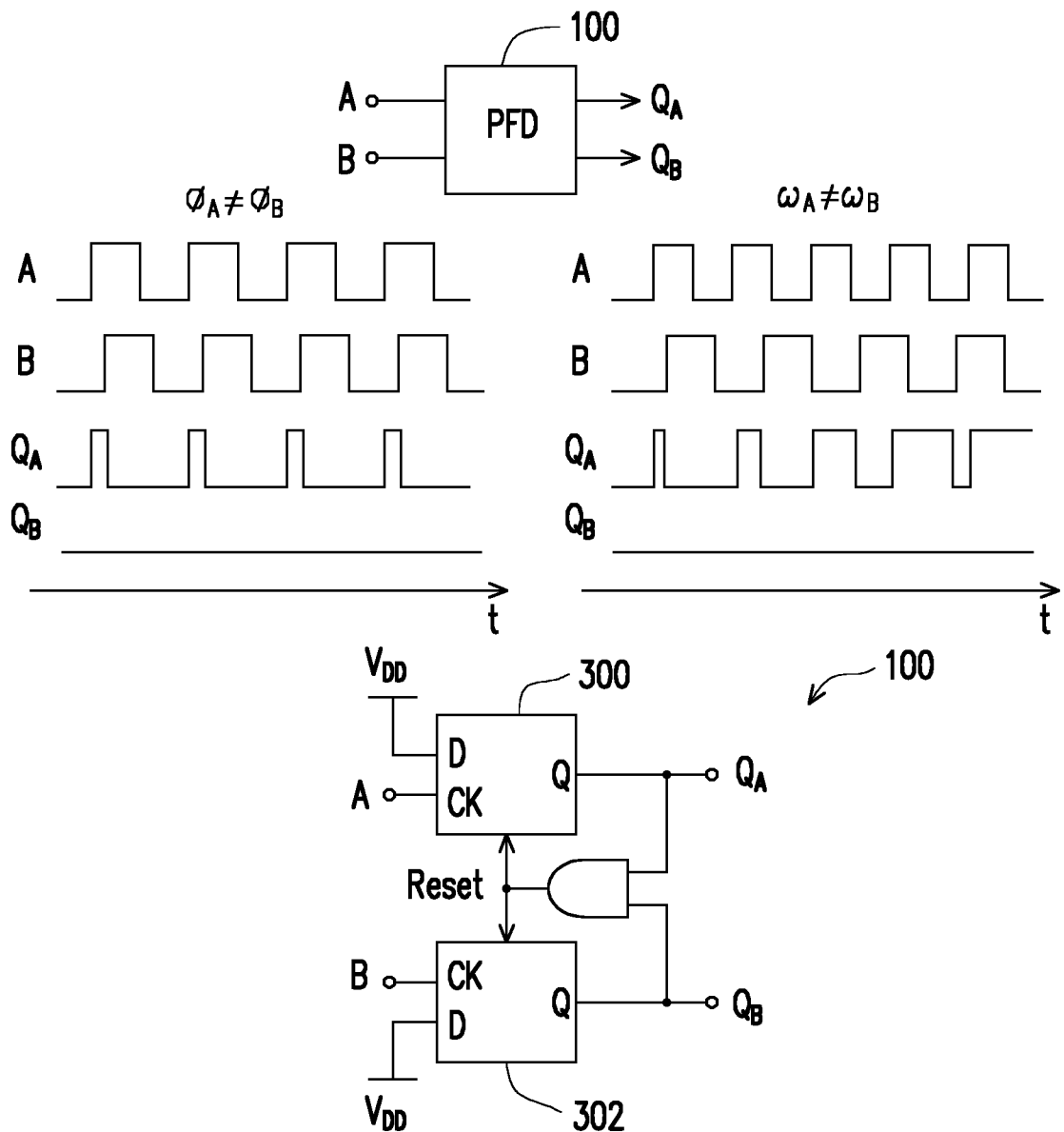
FIG. 2 is a drawing, schematically illustrating a circuit structure and an operation mechanism of a phase frequency detector (PFD) with the input/output signals, according to an embodiment of the invention.

As looking into the PFD 100, FIG. 2 is a drawing, schematically illustrating a circuit structure and an operation mechanism of a phase frequency detector (PFD) with the input/output signals, according to an embodiment of the invention.

Referring to FIG. 2, the PFD 100 has two input terminals A and B to receive the reference signal and the feedback signal and the detect the phase shift and frequency shift between the signal A and the signal B and then output the detected signal $Q_A$ and $Q_B$.

The detection mechanism in an embodiment is shown by the signal waveform. In the occurrence of phase shift, $\Phi_A \neq \Phi_B$ as shown at the left part, phase shift occurs between the signal A and the signal B. As detected by the PFD 100, the detected signal $Q_A$ and $Q_B$ are obtained in the time t axis. In this case, the signal A is a reference and the signal B has a delay with respect to the signal A. The frequency remains the same. The detected result from the N100 100 may obtain the detected signal $Q_A$ and the detected signal $Q_B$ stays at low level. This also implies that the phase of the signal B is shifted due to delay.

In the occurrence of frequency shift, $\omega_A \neq \omega_B$ as shown at the right part, the detected signal $Q_A$ reflects the effect from the frequency shift while the detected signal $Q_B$ in the embodiment also stay at the low level. As noted, the waveforms of the detected signals $Q_A$ and $Q_B$ are depending on the actual circuit of the PFD 100. Once the detected signal $Q_A$ or the detected signal $Q_B$ has a high-level portion, it would cause the charge pump to produce a voltage signal.

In an embodiment, the circuit of the PFD 100 may include two flip-flop blocks 300 and 302 and an AND gate. The clock terminal CK of the flip-flop blocks 300, 302 respectively server as the two input terminals A and B. The system voltage VDD is connected to the D terminals of the flip-flop blocks 300, 302. The AND gate receives the detected signals $Q_A$ and $Q_B$ for AND logic operation and feeding back to reset the flip-flop blocks 300, 302.

As noted, the PFD 100 does not need to limit to a specific circuit. In addition, the waveform of the detected signals $Q_A$ and $Q_B$ are not limited to the embodiments as shown. The detail of the PFD 100 may be referring to the way known in the art without specific limitation.

Figure 3:
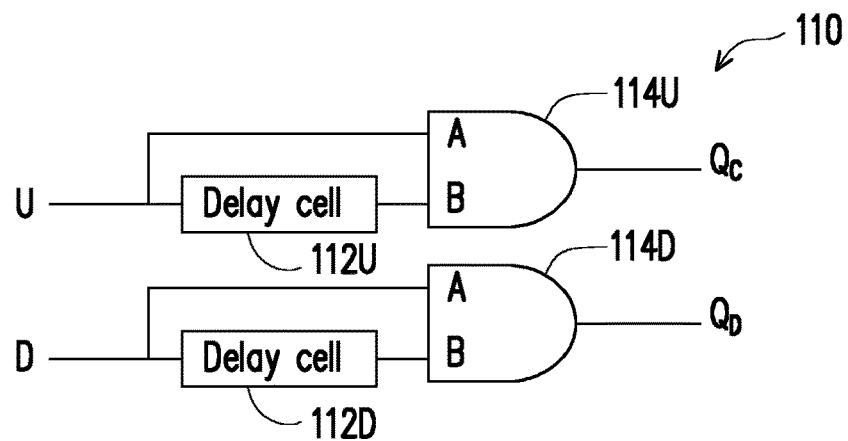
FIG. 3 is a drawing, schematically illustrating a circuit structure of a speed-up phase detector, according to an embodiment of the invention.
Figure 4:
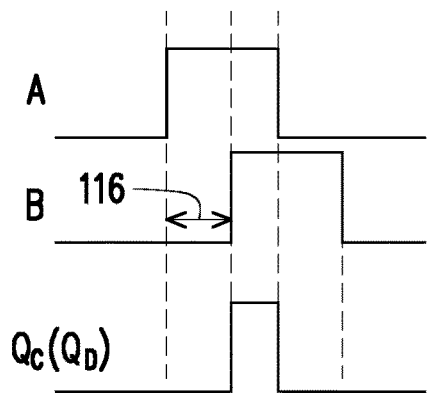
FIG. 4 is a drawing, schematically illustrating a speeding-up operation mechanism of the speed-up phase detector with the input/output signals, according to an embodiment of the invention.
Figure 5:
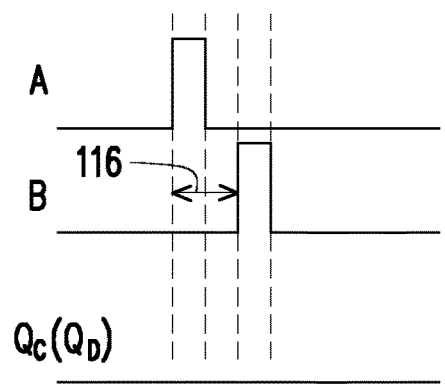
FIG. 5 is a drawing, schematically illustrating a normal operation mechanism of the speed-up phase detector with the input/output signals, according to an embodiment of the invention.

FIG. 3 is a drawing, schematically illustrating a circuit structure of a speed-up phase detector, according to an embodiment of the invention. FIG. 4 is a drawing, schematically illustrating a speeding-up operation mechanism of the speed-up phase detector with the input/output signals, according to an embodiment of the invention. FIG. 5 is a drawing, schematically illustrating a normal operation mechanism of the speed-up phase detector with the input/output signals, according to an embodiment of the invention.

Referring to FIG. 3 to FIG. 5, the speed-up phase detector 110 is described in detail, including a delay cell 112U corresponding to the up signal U and a delay cell 112D corresponding to the down signal D. For the one path for receiving the up signal U, the path includes the delay cell 112U which delays the up signal U by a given delay 116, as seen in FIG. 4 and FIG. 5, so that the up signal and the delay up signal are output to an AND gate 114U for AND logic operation. The AND gate 114U outputs an auxiliary up signal $Q_C$, which may also be referred as the auxiliary detected signal in accordance with the detected signals $Q_A$ and $Q_B$ as directly output from the PFD 100. For the down signal D, it is also delayed by the delay cell 112D by the same delay amount. The down signal D and the delay down signal form the delay cell 112D are operated by the AND gate 114D. The auxiliary down signal $Q_D$ may also be referred as another auxiliary detected signal. As a result, the pair of auxiliary detected signals $Q_C$ and $Q_D$ are also input to the charge pump 102. The detection mechanism of the speed-up phase detector (SUPD) 110 is described as follows.

Referring to FIG. 4 based on the circuit of the speed-up phase detector 110 in FIG. 3, the two terminals A and B of the AND gate 114U, 114D has the delay 116 therebetween with a given delay amount. Then, if the pulse width of the up signal is increased, the case is also referred as the speed up phase-locked case, in which the auxiliary detected signal $Q_C/Q_D$ has the pule corresponding to the overlap portion at the two terminals A and B. The pulse as produced would cause additional charging and adding to the voltage control signal Vcont, the charging action is speed up.

Referring to FIG. 5 based on the circuit of the speed-up phase detector 110 in FIG. 3, the two terminals A and B of the AND gate 114U, 114D has the delay 116 with a given delay amount. In the normal case, the pule width of the frequency signal remains narrow without increasing. Then, the delay 116 is sufficiently to shift the two signals at the terminal A and B. As a result, the auxiliary detected signal $Q_C/Q_D$ is at the low level, without causing additional charging action.

As noted, one speed-up phase detector 110 corresponding to one delay 116 is taken as an example for descriptions. In actual design, multiple delays 116 may be set for detection, then there are multiple speed-up phase detectors 110 respectively corresponding to the delays. It would be described in FIG. 8 later.

The pair of auxiliary detected signals $Q_C$ and $Q_D$ has the similar effect to the detected signals $Q_A$ and $Q_B$ for causing the charging effect to produce the voltage control signal Vcont. FIG. 6 is a drawing, schematically illustrating a circuit structure of a charge pump with speed-up charging capability, according to an embodiment of the invention.

Figure 6:
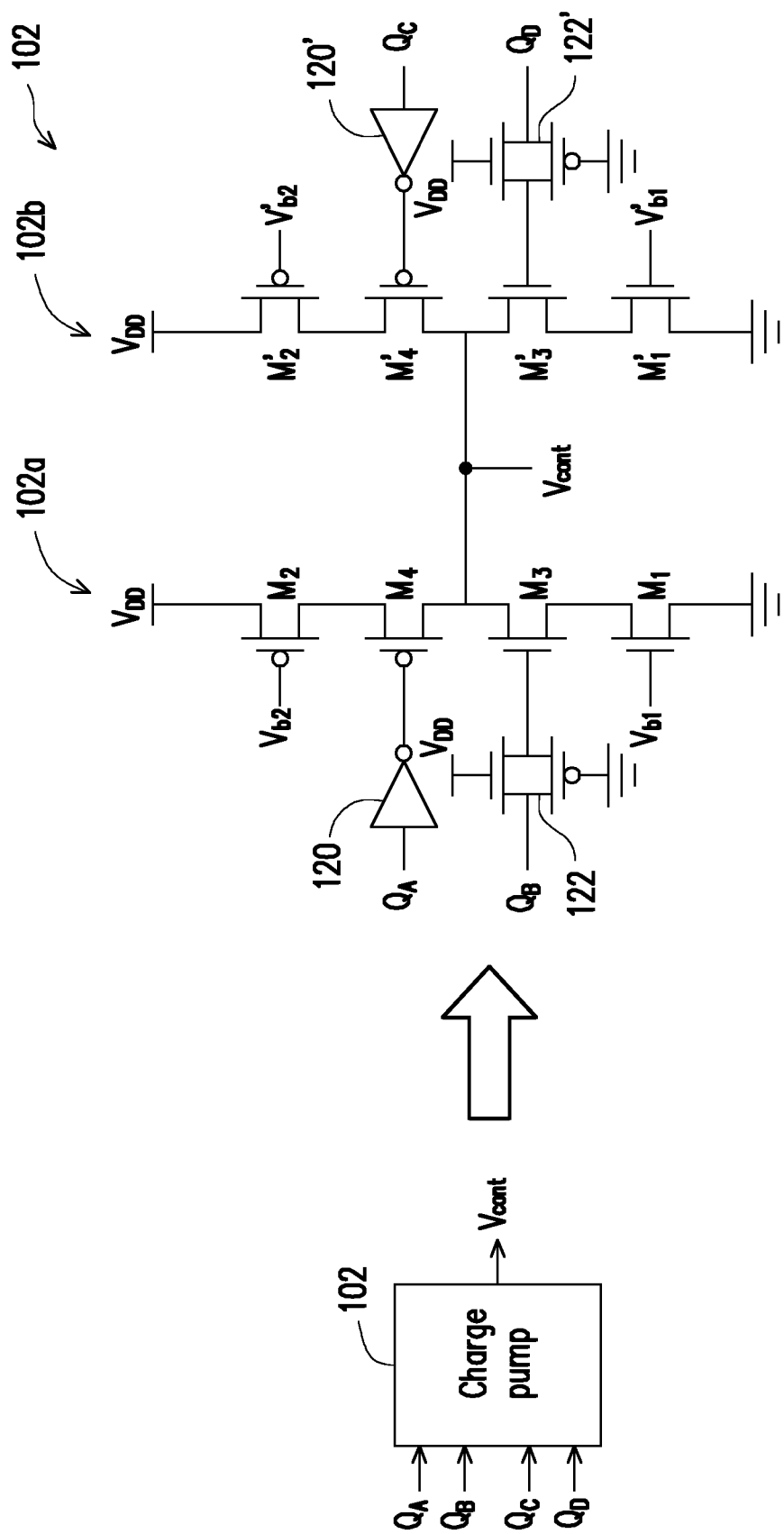
FIG. 6 is a drawing, schematically illustrating a circuit structure of a charge pump with speed-up charging capability, according to an embodiment of the invention.

Referring to FIG. 6, the charge pump 102 receives the pair of detected signal $Q_A$ and $Q_B$ from the PFD 100 and another pair of auxiliary detected signals $Q_C$ and $Q_D$ from the speed-up phase detector 110. The circuit structure is also shown at the right part in FIG. 6. The charge pump 102 in an embodiment includes a first charge pump 102a and a second charge pump 102b. The first charge pump 102a and the second charge pump 102b may be same circuits or different circuit. In an embodiment, the first charge pump 102a and the second charge pump 102b are the similar circuit structure for description.

In an embodiment, to the first charge pump 102a, it may receive the pair of detected signal $Q_A$ and $Q_B$ from the PFD 100. The first charge pump 102a in an embodiment may include a first inverter 120, a first transistor pair 122, and a first power string composed of P-type transistors $M_2$, $M_4$ and N-type transistors $M_1$, $M_3$ as connected in series between the system voltage $V_{DD}$ and the ground voltage. The first inverter 120 receives the up signal U from the PFD 100. The up signal U is the detected signal $Q_A$. The first transistor pair 122 receives the down signal D, which is also indicated as the detected signal $Q_B$ from the PFD 100. The first power source string as composed of transistors $M_1$ to $M_4$ is under control by outputs from the first inverter 120 and the first transistor pair 122 to provide the first voltage control signal Vcont at the output node, which is the connection node between the P-type transistors $M_4$ and N-type transistors $M_3$. Gate electrodes of the N-type transistor $M_1$ and the P-type transistor $M_2$ are respectively controlled by the voltages Vb1 and Vb2.

As noted, the circuit of the first charge pump 102a is not just limited to the embodiment and may be in different designs as known in the art. The invention does not need to be limited to a specific type of the first charge pump 102a.

In an embodiment, to the second charge pump 102b, it may be the same or different in circuit structure as the first charge pump 102a. However, in an embodiment, the second charge pump 102b is taken to have the same in circuit structure as the first charge pump 102a. In this situation, the second charge pump 102b may be easily fabricated together with the first charge pump 102a and the circuit design may also be simplified.

The second charge pump 102b in an embodiment may include a second inverter 120', a second transistor pair 122', and a second power string composed of P-type transistors M'$_2$, M'$_4$ and N-type transistors M'$_1$, M'$_3$ as connected in series between the system voltage V$_{DD}$ and the ground voltage. The second inverter 120' receives the auxiliary detected signal Q$_C$ from the SUPD 110. The second transistor pair 122' receives the auxiliary detected signal Q$_D$ from the SUPD 110. The second power source string as composed of transistors M'$_1$ to M'$_4$ is under control by outputs from the second inverter 120' and the second transistor pair 122' to provide the second voltage control signal Vcont at the output node, which is the connection node between the P-type transistors M'$_4$ and N-type transistors M'$_3$. Gate electrodes of the N-type transistor M'$_1$ and the P-type transistor M'$_2$ are respectively controlled by the voltages V'b1 and V'b2.

As noted, the voltage control signals Vcont respectively from the first charge pump 102a and the second charge pump 102b are output to the same output node in combination as also indicated as the voltage control signals Vcont. As also noted and to be described in FIG. 8, the number of charge pumps 102a, 102b may be more depending on various delays 116 being set as described in FIG. 3 to FIG. 5 for detecting various situations of phase/frequency shift.

Figure 7:
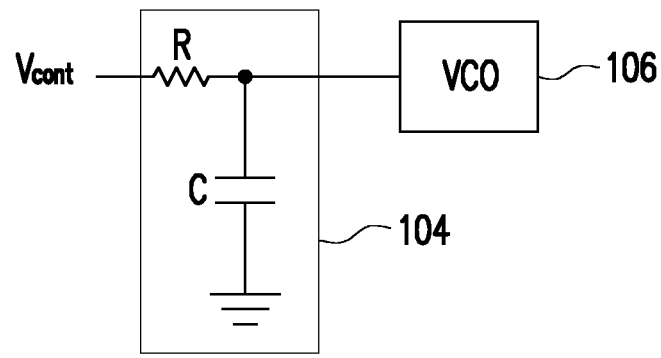
FIG. 7 is a drawing, schematically illustrating a circuit structure of the low-pass filter with the voltage control oscillator, according to an embodiment of the invention.

FIG. 7 is a drawing, schematically illustrating a circuit structure of the low-pass filter with the voltage control oscillator, according to an embodiment of the invention.

Referring to FIG. 7, the low-pass filter (LPF) 104 in an embodiment may be simply composed of a resistor R and a capacitor C as usually known in the art without specific limitation. Then, the voltage control signal Vcont after filtering by the low-pass filter (LPF) 104 is output to the VCO 106. The VCO 106 provides the frequency signal according to the voltage level of the input voltage originated from the voltage control signal Vcont of the speed-up charge pump 200 in FIG. 1.

Figure 8:
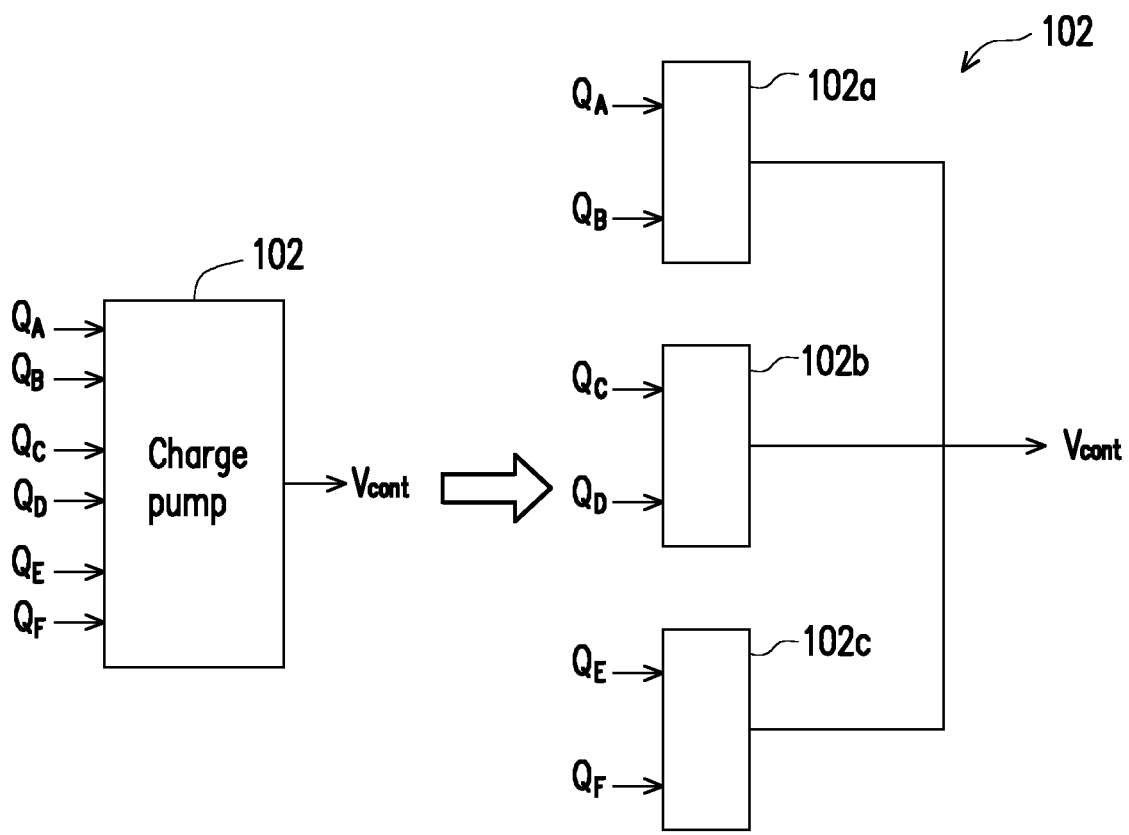
FIG. 8 is a drawing, schematically illustrating the charge pump with speed-up charging capability, according to an embodiment of the invention.

FIG. 8 is a drawing, schematically illustrating the charge pump with speed-up charging capability, according to an embodiment of the invention. Referring to FIG. 8 with the detection mechanism in FIG. 3 to FIG. 5 in an embodiment, there are multiple delays 116 in an example being set for detecting various frequency/phase changes. To adapt the detection, the charge pump 102 may be further modified to include more set of the charge pump 102c which is relating to another pair of auxiliary detected signals Q$_E$ and Q$_F$. All the charge pumps 102a, 102b, 102c are combined into the voltage control signal Vcont. In an embodiment, the detection mechanism for the charge pump 102c may be different from the detection mechanism for the charge pump 102b, not just based on the delay 116. In other words, the SUPD 110 may include various detections and correspondingly provide the pair of auxiliary detected signals to the charge pump 102, which also include the number of charge pumps 102a, 102b, 102c and so on.

The invention has also provided a method for operating speed-up charge pump. The method includes providing a first charge pump 102a receiving an up signal U and a down signal D in digital form to produce a first voltage control signal Vcont at an output node. Further, at least one speed-up phase detector 110 is provided, including: providing a first circuit path to receive the up signal U and the delay the up signal U by a predetermined delay 116 as a delay up signal and operate the up signal and the delay up signal by AND logic 114U into an auxiliary up signal as also indicated by the auxiliary detected signal Q$_C$. A second circuit path is also provided to receive the down signal D and delay the down signal D by the predetermined delay 116 as a delay down signal and operate the down signal and the delay down signal by AND logic 114D into an auxiliary down signal as also indicated by the auxiliary detected signal Q$_D$. At least one second charge pump 102b, 102c is provided, respectively receiving the auxiliary up and down signals to produce a second voltage control signal Vcont also at the output node.

As the operation of PLL 50, the invention has also provided a method for operating phase-locked loop 50. The method includes providing a phase frequency detector 100, receiving a reference signal with a reference frequency and a feedback signal, and outputting an up signal and a down signal. In addition, a first charge pump 102a is provided for receiving the up signal and the down signal in digital form to produce a first voltage control signal at an output node. At least one speed-up phase detector is provided, including providing a first circuit path to receive the up signal U and delay the up signal U by a predetermined delay 116 as a delay up signal and operate the up signal and the delay up signal by AND logic 114U into an auxiliary detected signal Q$_C$. A second circuit path is provided to receive the down signal and delay the down signal by the predetermined delay as a delay down signal and operate the down signal and the delay down signal by AND logic 114D into an auxiliary detected signal Q$_D$. At least one second charge pump 102b, 102c is provided for respectively receiving the auxiliary up and down signals to produce a second voltage control signal also at the output node of the first charge pump. A low-pass filter 104 is provided for filtering the first and second voltage control signals at the output node. A voltage control oscillator 106 is provided for receiving a voltage output of the low-pass filter to generate a frequency signal. A frequency divider 108 is provided for receiving the frequency signal to dividing a frequency by a factor N, being integer and greater than 0. An output of the frequency divider as the feedback signal is received by the phase frequency detector.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. An electronic circuit, comprising:
  a speed-up charge pump, comprising:
    a first charge pump, receiving an up signal and a down signal in digital form to produce a first voltage control signal at an output node;
    at least one speed-up phase detector, comprising:
      a first circuit path to receive the up signal and delay the up signal by a predetermined delay as a delay up signal and operate the up signal and the delay up signal by AND logic into an auxiliary up signal unrelated to the down signal; and
      a second circuit path to receive the down signal and delay the down signal by the predetermined delay as a delay down signal and operate the down signal and the delay down signal by AND logic into an auxiliary down signal unrelated to the up signal; and at least one second charge pump, respectively receiving the auxiliary up and down signals to produce a second voltage control signal also at the output node.

2. The electronic circuit of claim 1, wherein a quantity of the at least one speed-up phase detector is one with the predetermined delay and a quantity of the at least one second charge pump is one.

3. The electronic circuit of claim 1, wherein a quantity of the at least one speed-up phase detector is plural with a plurality of the predetermined delays and a quantity of the at least one second charge pump is plural corresponding to the quantity of the at least one speed-up phase detector.

4. The electronic circuit of claim 1, wherein the first charge pump includes:
a first inverter, to receive the up signal;
a first transistor pair, to receive the down signal; and
a first power source string, between a ground voltage and a system voltage, under control by outputs from the first inverter and the first transistor pair to provide the first voltage control signal.

5. The electronic circuit of claim 4, wherein the second charge pump includes:
a second inverter, to receive the auxiliary up signal;
a second transistor pair, to receive the auxiliary down signal; and
a second power source string, between the ground voltage and the system voltage, under control by outputs from the second inverter and the second transistor pair to provide the second voltage control signal.

6. The electronic circuit of claim 1, wherein the first voltage control signal and the second voltage control signal at the output node are used to control a voltage control oscillator to produce a frequency pulse signal.

7. The electronic circuit of claim 1, in each of the speed-up phase detector,
the first circuit path comprising:
a first delay circuit with the predetermined delay, receiving the up signal and outputting the delay up signal; and
a first AND logic gate, receiving the up signal and the delay up signal and outputting the auxiliary up signal, and
the second circuit path comprising:
a second delay circuit with the predetermined delay, receiving the down signal and outputting the delay down signal; and
a second AND logic gate, receiving the down signal and the delay down signal and outputting the auxiliary down signal.

8. The electronic circuit of claim 1, wherein the electronic circuit is serving as a phase-locked loop, the electronic circuit further comprising:
a phase frequency detector, receiving a reference signal with a reference frequency and a feedback signal, and outputting the up signal and the down signal as received by the speed-up charge pump;
a low-pass filter, filtering the first and second voltage control signals at the output node;
a voltage control oscillator, receiving a voltage output of the low-pass filter to generate a frequency signal; and
a frequency divider, receiving the frequency signal to dividing in frequency by a factor N, being integer and greater than 0,
wherein an output of the frequency divider as the feedback signal is received by the phase frequency detector.

9. The phase-locked loop of claim 8, wherein the at least one speed-up phase detector is single with the predetermined delay and the at least one second charge pump is single.

10. The phase-locked loop of claim 8, wherein the at least one speed-up phase detector is plurality with a plurality of the predetermined delays and the at least one second charge pump is plurality corresponding to a quantity of the at least one speed-up phase detector.

11. A method for operating an electronic circuit, comprising:
providing a speed-up charge pump, comprising:
providing a first charge pump, receiving an up signal and a down signal in digital form to produce a first voltage control signal at an output node;
providing at least one speed-up phase detector, comprising:
providing a first circuit path to receive the up signal and delay the up signal by a predetermined delay as a delay up signal and operate the up signal and the delay up signal by AND logic into an auxiliary up signal unrelated to the down signal; and
providing a second circuit path to receive the down signal and delay the down signal by the predetermined delay as a delay down signal and operate the down signal and the delay down signal by AND logic into an auxiliary down signal unrelated to the up signal; and
providing at least one second charge pump, respectively receiving the auxiliary up and down signals to produce a second voltage control signal also at the output node.

12. The method of claim 11, wherein a quantity of the at least one speed-up phase detector as provided is one with the predetermined delay and a quantity of the at least one second charge pump is one.

13. The method of claim 11, wherein a quantity of the at least one speed-up phase detector as provided is plural with a plurality of the predetermined delays and a quantity of the at least one second charge pump is plural corresponding to the quantity of the at least one speed-up phase detector.

14. The method of claim 11, wherein the first charge pump as provided includes:
a first inverter, to receive the up signal;
a first transistor pair, to receive the down signal; and
a first power source string, between a ground voltage and a system voltage, under control by outputs from the first inverter and the first transistor pair to provide the first voltage control signal.

15. The method of claim 14, wherein the second charge pump as provided includes:
a second inverter, to receive the auxiliary up signal;
a second transistor pair, to receive the auxiliary down signal; and
a second power source string, between the ground voltage and the system voltage, under control by outputs from the second inverter and the second transistor pair to provide the second voltage control signal.

16. The method of claim 11, wherein the first voltage control signal and the second voltage control signal at the output node is used to control a voltage control oscillator to produce a frequency pulse signal.

17. The method of claim 11, in each of the speed-up phase detector as provided,
the first circuit path comprising:
a first delay circuit with the predetermined delay, receiving the up signal and outputting the delay up signal; and a first AND logic gate, receiving the up signal and the delay up signal and outputting the auxiliary up signal, and the second circuit path comprising:
a second delay circuit with the predetermined delay, receiving the down signal and outputting the delay down signal; and
a second AND logic gate, receiving the down signal and the delay down signal and outputting the auxiliary down signal.

18. The method of claim 11, wherein the electronic circuit as provided is serving as a phase-locked loop, the method further comprising:
providing a phase frequency detector, receiving a reference signal with a reference frequency and a feedback signal, and outputting the up signal and the down signal as received by the speed-up charge pump;
providing a low-pass filter, filtering the first and second voltage control signals at the output node;
providing a voltage control oscillator, receiving a voltage output of the low-pass filter to generate a frequency signal; and
providing a frequency divider, receiving the frequency signal to dividing a frequency by a factor N, being integer and greater than 0,
wherein an output of the frequency divider as the feedback signal is received by the phase frequency detector.

19. The method of claim 18, wherein the at least one speed-up phase detector as provided is single with the predetermined delay and the at least one second charge pump is single.

20. The method of claim 18, wherein the at least one speed-up phase detector as provided is plurality with a plurality of the predetermined delays and the at least one second charge pump is plurality corresponding to a quantity of the at least one speed-up phase detector.

* * * * *